United States Patent
Boufnichel

(10) Patent No.: US 11,335,678 B2
(45) Date of Patent: May 17, 2022

(54) INTEGRATED CIRCUIT COMPRISING A THREE-DIMENSIONAL CAPACITOR

(71) Applicant: STMICROELECTRONICS (TOURS) SAS, Tours (FR)

(72) Inventor: Mohamed Boufnichel, Monnaie (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 4 days.

(21) Appl. No.: 16/801,038

(22) Filed: Feb. 25, 2020

(65) Prior Publication Data
US 2020/0286886 A1    Sep. 10, 2020

(30) Foreign Application Priority Data

Mar. 4, 2019 (FR) ...................................... 1902183

(51) Int. Cl.
| | | |
|---|---|---|
| *H01L 27/08* | (2006.01) | |
| *H01L 49/02* | (2006.01) | |
| *H01L 27/06* | (2006.01) | |

(52) U.S. Cl.
CPC ...... *H01L 27/0805* (2013.01); *H01L 27/0629* (2013.01); *H01L 28/87* (2013.01); *H01L 28/90* (2013.01)

(58) Field of Classification Search
None
See application file for complete search history.

(56) References Cited

U.S. PATENT DOCUMENTS

| | | | |
|---|---|---|---|
| 6,661,069 B1* | 12/2003 | Chinthakindi | H01G 5/011 257/415 |
| 9,647,057 B2* | 5/2017 | Voiron | H01L 28/87 |
| 2003/0222335 A1 | 12/2003 | Hirano et al. | |
| 2005/0233518 A1 | 10/2005 | Ishida et al. | |
| 2009/0108403 A1* | 4/2009 | Gogoi | H01L 28/91 257/532 |
| 2010/0230787 A1* | 9/2010 | Guiraud | H01L 29/66181 257/532 |
| 2011/0175152 A1* | 7/2011 | Booth, Jr. | H01L 28/40 257/306 |
| 2012/0012982 A1* | 1/2012 | Korec | H01L 28/20 257/533 |
| 2012/0211865 A1* | 8/2012 | Tian | H01L 28/40 257/532 |
| 2013/0065390 A1 | 3/2013 | Haba et al. | |
| 2013/0270675 A1* | 10/2013 | Childs | H01L 23/5226 257/532 |

(Continued)

FOREIGN PATENT DOCUMENTS

EP    1 953 778    8/2008

*Primary Examiner* — Julio J Maldonado
*Assistant Examiner* — Lawrence C Tynes, Jr.
(74) *Attorney, Agent, or Firm* — Seed IP Law Group LLP

(57) ABSTRACT

The present disclosure concerns an integrated circuit comprising a substrate, the substrate comprising a first region having a first thickness and a second region having a second thickness smaller than the first thickness, the circuit comprising a three-dimensional capacitor formed inside and on top of the first region, and at least first and second connection terminals formed on the second region, the first and second connection terminals being respectively connected to first and second electrodes of the three-dimensional capacitor.

18 Claims, 5 Drawing Sheets

(56) References Cited

U.S. PATENT DOCUMENTS

| | | | |
|---|---|---|---|
| 2014/0183611 A1* | 7/2014 | Chang | H01L 28/90 |
| | | | 257/301 |
| 2015/0123242 A1* | 5/2015 | Jen | H01L 23/5226 |
| | | | 257/532 |
| 2015/0179731 A1* | 6/2015 | Lasiter | H01L 28/90 |
| | | | 257/532 |
| 2015/0200242 A1* | 7/2015 | England | H01L 23/49827 |
| | | | 257/532 |
| 2016/0268144 A1* | 9/2016 | Voiron | H01L 21/32133 |
| 2016/0293334 A1* | 10/2016 | Ehara | H01G 4/018 |
| 2017/0104057 A1* | 4/2017 | Voiron | H01L 28/91 |
| 2019/0035880 A1* | 1/2019 | Voiron | H01L 28/91 |
| 2019/0393153 A1* | 12/2019 | Wang | H01L 23/5283 |
| 2020/0058580 A1* | 2/2020 | Lin | H01L 28/20 |

* cited by examiner

US 11,335,678 B2

INTEGRATED CIRCUIT COMPRISING A THREE-DIMENSIONAL CAPACITOR

BACKGROUND

Technical Field

The present disclosure generally concerns integrated circuits, and more particularly aims at an integrated circuit comprising a three-dimensional capacitor.

Description of the Related Art

Conventionally, in the field of integrated circuits, a capacitor is formed between conductive layers parallel to the surface of a substrate. It can then be referred to a two-dimensional capacitor.

To increase the capacitance per surface area unit of the capacitor, so-called three-dimensional capacitors, formed between conductive layers at least partly extending on the lateral walls and on the bottom of trenches orthogonal to the surface of the substrate have been provided.

It would be desirable to at least partly improve certain aspects of known integrated circuits comprising three-dimensional capacitors.

BRIEF SUMMARY

An embodiment provides an integrated circuit comprising a substrate, the substrate comprising a first region having a first thickness and a second region having a second thickness smaller than the first thickness, the circuit comprising a three-dimensional capacitor formed inside and on top of the first region, and at least first and second connection terminals formed on the second region, the first and second connection terminals being respectively connected to first and second electrodes of the three-dimensional capacitor.

According to an embodiment, the three-dimensional capacitor comprises a stack of a first conductive layer, of a first dielectric layer, and of a second conductive layer arranged on the side of the first dielectric layer opposite to the first conductive layer, the stack extending on the lateral walls and on the bottom of trenches formed in the first region of the substrate, the first and second layers respectively forming the first and second electrodes of the three-dimensional capacitor.

According to an embodiment, the stack further comprises a second dielectric layer arranged on the side of the second conductive layer opposite to the first dielectric layer, and a third conductive layer arranged on the side of the second dielectric layer opposite to the second conductive layer, the third conductive layer being connected to the first connection terminal.

According to an embodiment, the first region is a central region of the substrate, and the second region is a peripheral region of the substrate.

According to an embodiment, the surface of the substrate opposite to the first and second connection terminals is substantially planar.

According to an embodiment, the thickness difference between the first and second regions of the substrate is in the range from 10 to 40 μm.

According to an embodiment, the integrated circuit further comprises third and fourth connection terminals respectively arranged opposite the first and second connection terminals, on the side of the substrate opposite to the first and second connection terminals, the third connection terminal being connected to the first connection terminal by a first conductive via crossing the substrate and the fourth connection terminal being connected to the second connection terminal by a second conductive via crossing the substrate.

According to an embodiment, the first and second connection terminals each comprise a solder bump or a metallic connection pillar.

According to an embodiment, the integrated circuit comprises an insulating protection layer extending on the second region of the substrate, where the insulating protection layer does not extend on the first region of the substrate.

Another embodiment provides a method of manufacturing an integrated circuit, comprising the steps of:

a) performing a local etching of a portion of the thickness of a substrate to define in the substrate a first region having a first thickness and a second region having a second thickness smaller than the first thickness;

b) forming a three-dimensional capacitor inside and on top of the first region; and c) forming on the second region first and second connection terminals respectively connected to first and second electrodes of the three-dimensional capacitor.

The foregoing and other features and advantages will be discussed in detail in the following non-limiting description of specific embodiments in connection with the accompanying drawings.

DETAILED DESCRIPTION

Figure 1:
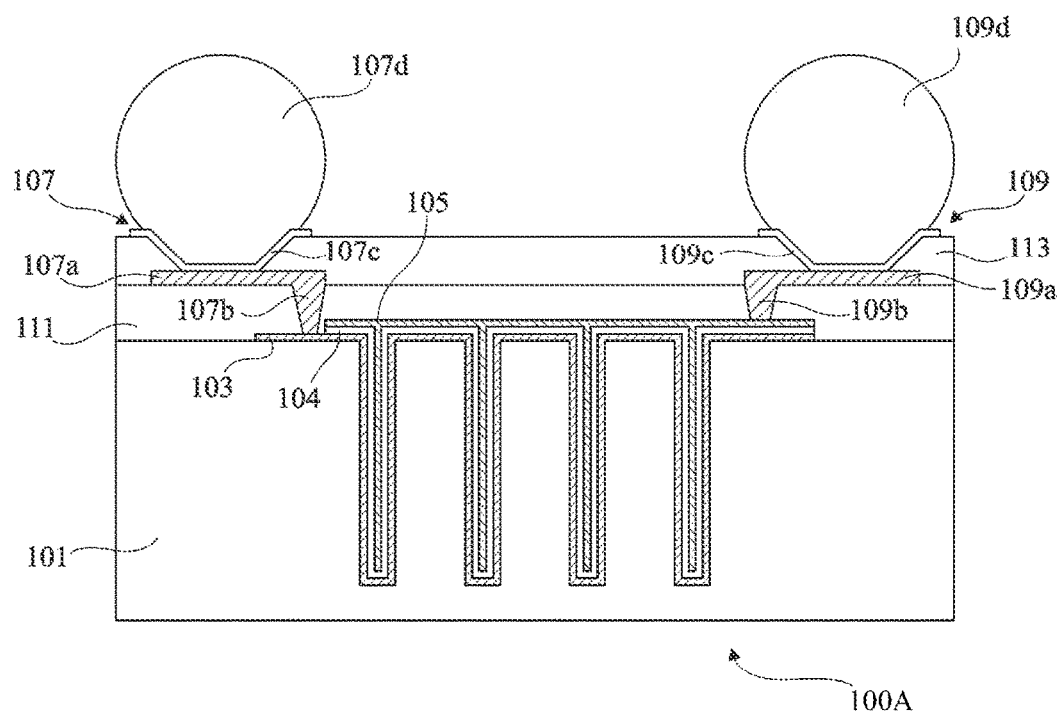
FIG. 1 is a simplified cross-section view of an example of an integrated circuit comprising a three-dimensional capacitor.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the actual forming of the three-dimensional capacitors of the described integrated circuits has not been detailed, the described embodiments being compatible with all or part of known three-dimensional capacitor forming methods. Further, what uses can be made of the described integrated circuits has not been detailed, the described embodiments being compatible with usual applications of integrated circuits comprising three-dimensional capacitors.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "substantially", and "approximately" are used herein to designate a tolerance of plus or minus 10%, preferably of plus or minus 5%, of the value in question.

FIG. 1 is a simplified cross-section view of an example of an integrated circuit comprising a three-dimensional capacitor 100A.

The integrated circuit of FIG. 1 comprises a substrate 101, for example, a semiconductor substrate, for example, a silicon substrate. In this example, substrate 101 has a substantially constant thickness across substantially its entire surface. A stack of a first conductive layer 103, of a dielectric layer 104, and of a second conductive layer 105 extends continuously on the upper surface of the substrate as well as on the lateral walls and on the bottom of non-through trenches or cavities extending from the upper surface of the structure, towards the lower surface thereof. Layers 103 and 105 respectively form first and second electrodes of the capacitor 100A, and layer 104 forms the dielectric of the capacitor. Each of layers 103 and 105 is for example made of polysilicon or of metal. Layer 104 is for example made of silicon oxide. Although this is not shown in FIG. 1, an insulating layer, for example, made of silicon oxide, may form an interface between conductive layer 103 and substrate 101.

On the upper surface side of substrate 101, the integrated circuit of FIG. 1 comprises two terminals 107 and 109 of connection to an external device, respectively connected to electrode 103 and to electrode 105 of the capacitor. In the example of FIG. 1, the capacitor 100A is arranged inside and on top of a central region of substrate 101, and connection terminals 107 and 109 are arranged on a peripheral region of substrate 101.

In the shown example, the integrated circuit comprises an insulating layer 111, for example, made of silicon oxide, deposited after layers 103, 104, and 105 of the capacitor and substantially coating the entire upper surface of substrate 101. Connection terminal 107 (in the left-hand portion of the drawing) comprises a conductive area 107a, for example, made of metal, for example, of copper or of aluminum, arranged on the upper surface of insulating layer 111, and a conductive via 107b, for example, made of the same material as area 107a, crossing layer 111 and connecting conductive area 107a to the upper surface of layer 103, at the level of an extension of layer 103 which is not coated with layers 104 and 105, extending on the upper surface of substrate 101 opposite conductive area 107a. Connection terminal 109 (in the right-hand portion of the drawing) comprises a conductive area 109a, for example, made of the same material as area 107a, arranged on the upper surface of insulating layer 111, and a conductive via 109b, for example, made of the same material as via 107b, crossing layer 111 and connecting conductive area 109a to the upper surface of layer 105, at the level of an extension of layer 105 extending on the upper surface of substrate 101 opposite conductive area 109a.

In the example of FIG. 1, the integrated circuit further comprises an insulating layer 113, for example, made of silicon nitride, of resin, or of silicon oxide, deposited after the forming of conductive areas and vias 107a, 107b, 109a, 109b, and substantially coating the entire upper surface of substrate 101. Insulating layer 113 comprises a first through opening formed opposite conductive area 107a and emerging on the upper surface of conductive area 107a, and a second through opening formed opposite conductive area 109a and emerging on the upper surface of conductive area 109a. Connection terminal 107 comprises a metallization 107c in contact with conductive area 107a, extending on the lateral walls and at the bottom of the first opening formed in layer 113 and, possibly, over a portion of the upper surface of layer 113 at the periphery of the first opening formed in layer 113. Connection terminal 109 comprises a metallization 109c in contact with conductive area 109a, extending on the lateral walls and at the bottom of the second opening formed in layer 113 and, possibly, over a portion of the upper surface of layer 113 at the periphery of the second opening formed in layer 113. Metallizations 107c and 109c are for example of same nature. Each of metallizations 107c and 109c for example comprises a stack of a plurality of metal layers of different natures, sometimes called UBM ("Under Bump Metallization"), for example, a titanium-nickel-gold stack, a titanium-nickel-copper-gold stack, or a titanium-nickel-silver stack.

Each of metallizations 107c and 109c is intended to receive, on top of and in contact with its upper surface, a connection element 107d, respectively 109d, made of a solder material, for example, based on tin and/or of lead and/or of silver, intended to be soldered to a metal area of connection of an external device. In the example of FIG. 1, connection elements 107d and 109d are solder bumps.

There exists in the industry of integrated circuits a need for relatively thin chips.

In the integrated circuit of FIG. 1, the total thickness of the chip substantially corresponds to the sum of the thicknesses of substrate 101, of insulating layers 111 and 113, and of the portion of connection elements 107d and 109d protruding from the upper surface of insulating layer 113. The thinning of substrate 101 is limited by the depth of the trenches of the three-dimensional capacitor.

The thickness of substrate 101 is for example in the range from 400 to 900 μm, for example about 500 μm (for 6" wafers) to about 800 μm (for 8" wafers). The depth of each of the trenches of the three-dimensional capacitor is for example in the range from 25 to 50 μm, for example about 40 μm. The width of each of the trenches of the three-dimensional capacitor is for example in the range from 0.5 to 1 µm, for example about 0.7 µm. The thickness of insulating layer 111 is for example in the range from 0.8 to 1.5 µm, for example about 1 µm. The thickness of insulating layer 113 is for example in the range from 0.8 to 1.5 µm, for example about 1 µm. The height of the portion of connection elements 107d, 109d protruding from the upper surface of layer 113 is for example in the range from 20 to 80 µm. As example, connection elements 107d, 109d are substantially spherical solder bumps, having a diameter in the range from 40 to 60 µm.

Figure 2:
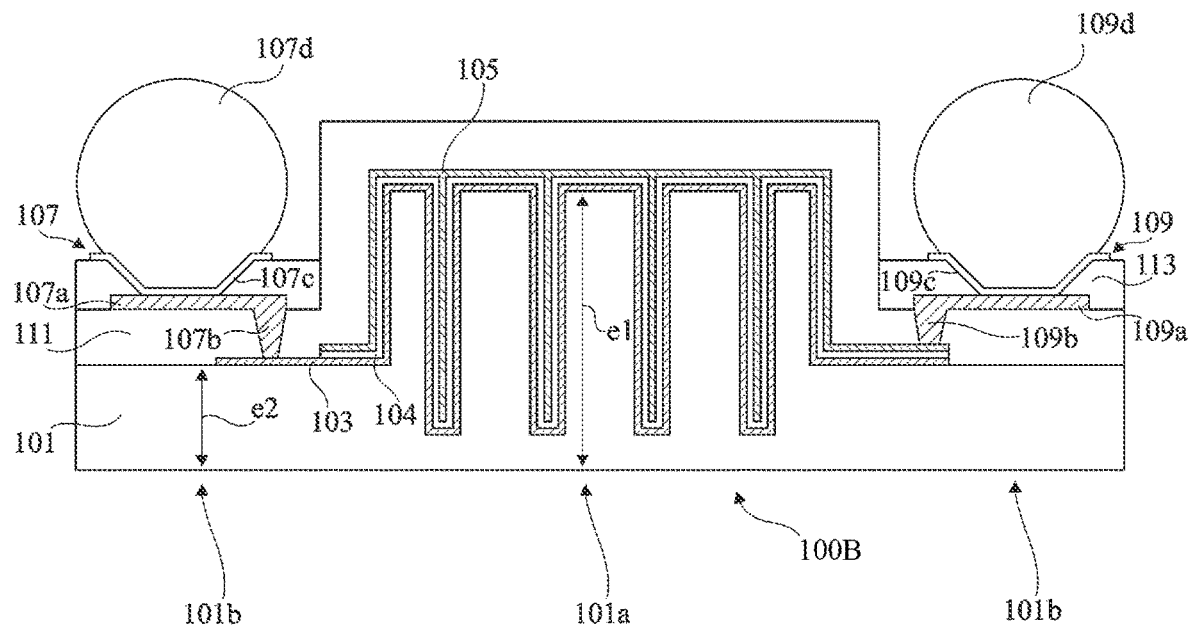
FIG. 2 is a simplified cross-section view of an embodiment of an integrated circuit comprising a three-dimensional capacitor.

FIG. 2 is a simplified cross-section view of an embodiment of an integrated circuit comprising a three-dimensional capacitor 100B.

The integrated circuit of FIG. 2 comprises elements common with the integrated circuit of FIG. 1. These elements will not be detailed again hereafter. Hereafter, only the differences between the two circuits will be highlighted.

The integrated circuit of FIG. 2 differs from the integrated circuit of FIG. 1 mainly in that, in the circuit of FIG. 2, substrate 101 does not have a constant thickness but comprises a first region 101a having a first thickness e1, and a second region 101b not stacked with the first region, having a second thickness e2 smaller than e1. In the shown example, region 101a is a central region of substrate 101, and region 101b is a peripheral region of substrate 101. The described embodiments are however not limited to this specific case. In this example, the lower surface of substrate 101 is substantially planar. On its upper surface side, substrate 101 has a plateau or mesa structure. More particularly, central region 101a of substrate 101 forms a pad or island protruding by a height substantially equal to e1−e2, with respect to the upper surface of peripheral region 101b.

The three-dimensional capacitor is formed inside and on top of region 101a of thickness e1 of substrate 101, and connection terminals 107 and 109 of the circuit are formed on region 101b of thickness e2 of substrate 101. In the shown example, layers 103, 104, and 105 extend on the sides of the mesa structure formed by central region 101a of substrate 101 and over a portion of the upper surface of peripheral region 101b of substrate 101, to enable to take an electric contact on layer 103 via connection terminal 107 and on layer 105 via connection terminal 109, similarly to what has been described in relation with FIG. 1.

Thickness e1 of central portion 101a of substrate 101 is for example identical or similar to the thickness of substrate 101 of FIG. 1. The dimensions of the trenches of the three-dimensional capacitor 100B may be identical or similar to what has been described in relation with FIG. 1. Thickness e2 of peripheral portion 101b of substrate 101 is selected to be sufficiently high to, on the one hand, guarantee the mechanical resistance of substrate 101, and the other hand, ascertain that the upper surface of connection elements 107d, 109d remains raised with respect to the upper surface of the central portion of the circuit. As an example, difference e1−e2 between the thickness of region 101a and the thickness of region 101b is in the range from 10 to 40 µm.

An advantage of the integrated circuit of FIG. 2 is that the local thinning of substrate 101 in region 101b of forming of the terminals of connection of the circuit to an external device, provides a chip having a total thickness decreased with respect to the example of FIG. 1, while keeping a substrate region 101a of relatively significant thickness to form the three-dimensional capacitor.

It should be noted that in the example of FIG. 2, insulating layer 113 is present only on the upper surface of peripheral region 101b of substrate 101, rather than on the upper surface of central region 101a of substrate 101. This provides an additional gain on the total thickness of the chip (by a value substantially equal to the thickness of layer 113). Insulating layer 111 coats the entire upper surface of the substrate to protect upper electrode 105 of the three-dimensional capacitor against possible short-circuits. As a variation, insulating layer 113 may also extend over the entire upper surface of substrate 101.

Figure 3:
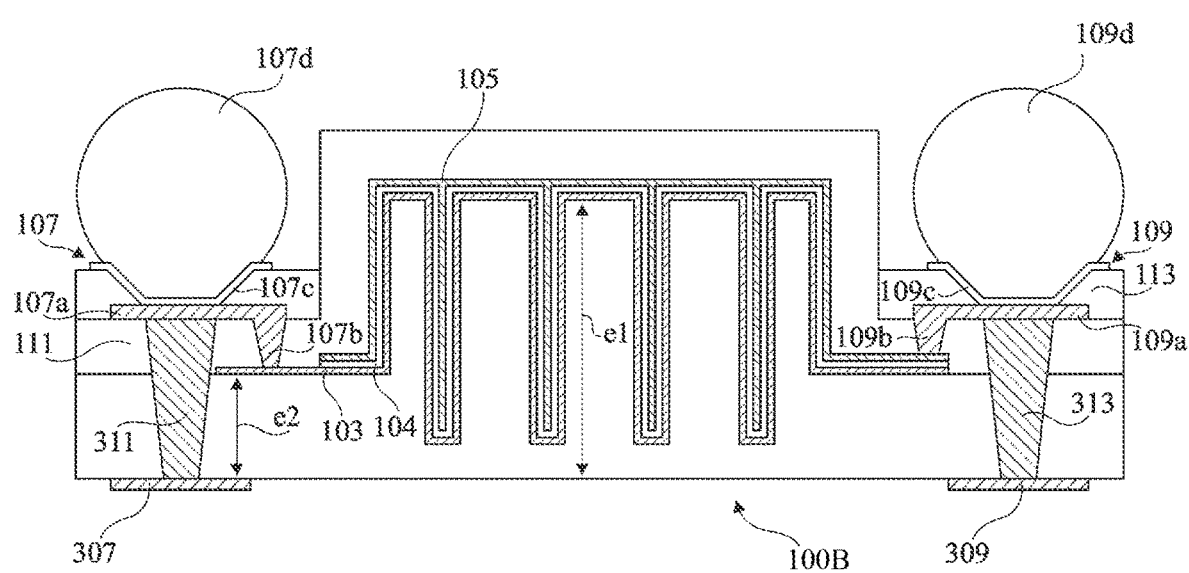
FIG. 3 is a simplified cross-section view of an alternative embodiment of the integrated circuit of FIG. 2.

FIG. 3 is a simplified cross-section view of an alternative embodiment of the integrated circuit of FIG. 2.

The variation of FIG. 3 differs from the example of FIG. 2 mainly in that, in the example of FIG. 3, the integrated circuit further comprises, in addition to the connection terminals 107 and 109 arranged on the upper surface side of the substrate, connection terminals 307 and 309 arranged on the lower surface side of the substrate. In this example, terminal 307 comprises a conductive area, for example, made of metal, for example, of copper or of aluminum, arranged on the lower surface of substrate 101, opposite conductive area 107a of terminal 107. Terminal 309 comprises a conductive area, for example, made of the same material as the conductive area of terminal 307, arranged on the lower surface of substrate 101, opposite conductive area 109a of terminal 109. Terminals 307 and 309 may be electrically insulated from substrate 101 by an insulating interface layer, not shown in FIG. 3.

The integrated circuit of FIG. 3 further comprises a conductive via 311 vertically crossing insulating layer 111 and substrate 101, and connecting the lower surface of conductive area 107a of terminal 107 to the upper surface of terminal 307. The circuit of FIG. 3 further comprises a conductive via 313 vertically crossing insulating layer 111 and substrate 101, and connecting the lower surface of conductive area 109a of terminal 109 to the upper surface of terminal 309. Conductive vias 311 and 313 are for example made of metal, for example, of copper. Each of conductive vias 311 and 313 may be electrically insulated from substrate 101 by an insulating interface layer, not shown in FIG. 3.

An advantage of the alternative embodiment of FIG. 3 is that it allows a connection at the upper surface and at the lower surface of the circuit. This enables to form assemblies comprising a plurality of vertically stacked interconnected integrated circuits. As an example, a plurality of circuits of the type described in relation with FIG. 3 may be stacked, each circuit having its upper connection terminals 107 and 109 respectively connected to the lower connection terminals 307 and 309 of the overlying circuit, to connect in parallel the three-dimensional capacitors of the different circuits.

FIGS. 4 to 10 are simplified cross-section views illustrating successive steps of an example of a method of manufacturing an integrated circuit of the type described in relation with FIG. 2.

Figure 4:
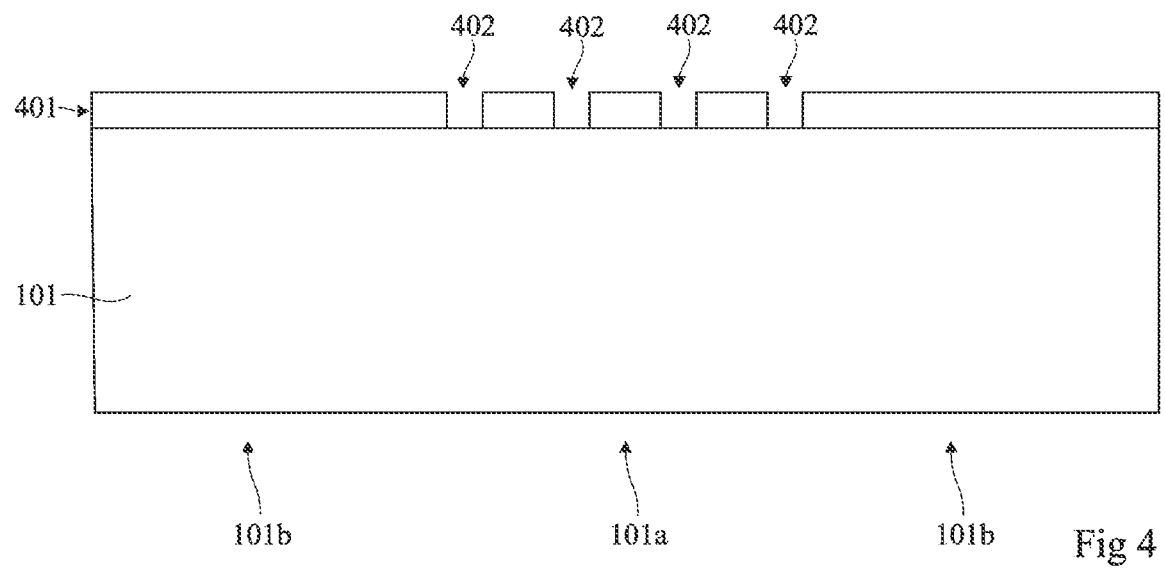
FIG. 4 is a simplified cross-section view illustrating a step of a method of manufacturing an integrated circuit comprising a three-dimensional capacitor.

FIG. 4 illustrates a step of deposition of a hard mask 401 on the upper surface of substrate 101. At this stage, the thickness of substrate 101 is substantially constant over substantially the entire surface of the circuit. Hard mask 401 is for example made of an insulating material, for example, of silicon oxide. It comprises through openings 402 opposite the future trenches of the three-dimensional capacitor 100B. Except for the areas of substrate 101 located opposite openings 402, hard mask 401 substantially covers the entire upper surface of substrate 101. Hard mask 401 is for example formed by deposition, photolithography, and etching of a layer made of an insulating material.

Figure 5:
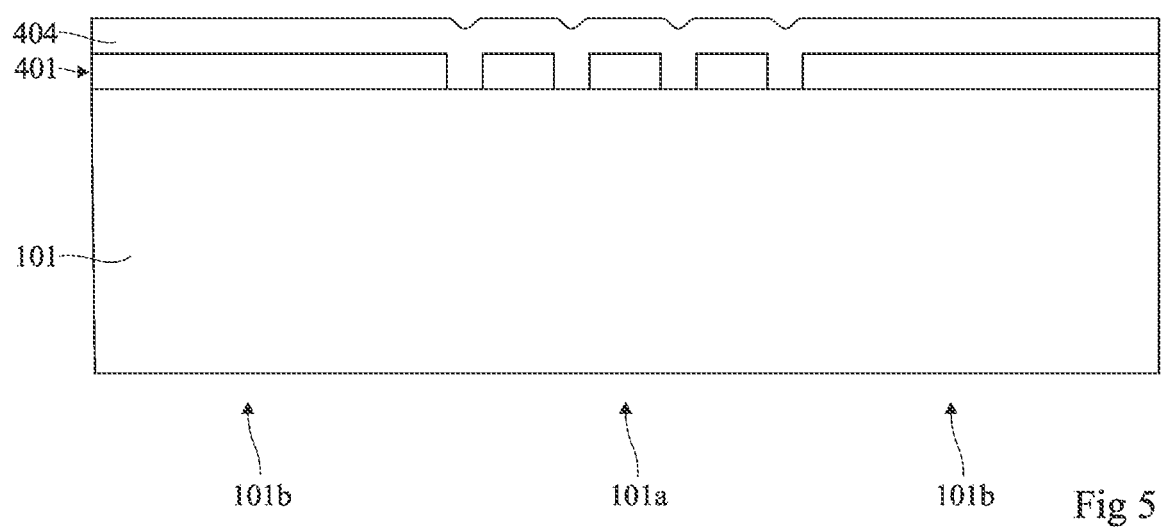
FIG. 5 is a simplified cross-section view illustrating another step of a method of manufacturing an integrated circuit comprising a three-dimensional capacitor.

FIG. 5 illustrates a step of deposition of a protection layer 404 on the upper surface of the circuit. Layer 404 is made of a material selectively etchable over the material of hard mask 401. Layer 404 is for example made of an insulating material, for example, of silicon nitride. Layer 404 is continuously deposited over substantially the entire upper surface of the circuit. Thus, layer 404 is in contact with the upper surface of hard mask 401, as well as with the upper surface of substrate 101 at the bottom of openings 402 of hard mask 401.

Figure 6:
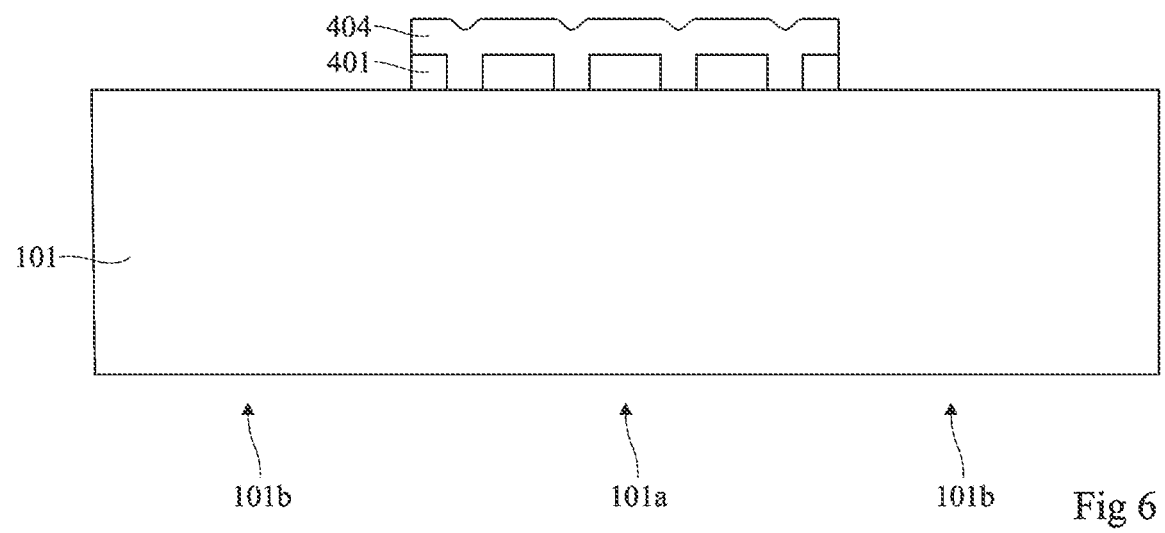
FIG. 6 is a simplified cross-section view illustrating another step of a method of manufacturing an integrated circuit comprising a three-dimensional capacitor.

FIG. 6 is a step of local removal of the stack of layers 401 and 404 opposite peripheral portion 101b of substrate 101. Layers 401 and 404 are however kept opposite central portion 101a of substrate 101. The local removal of layers 401 and 404 is for example performed by photolithography and etching.

Figure 7:
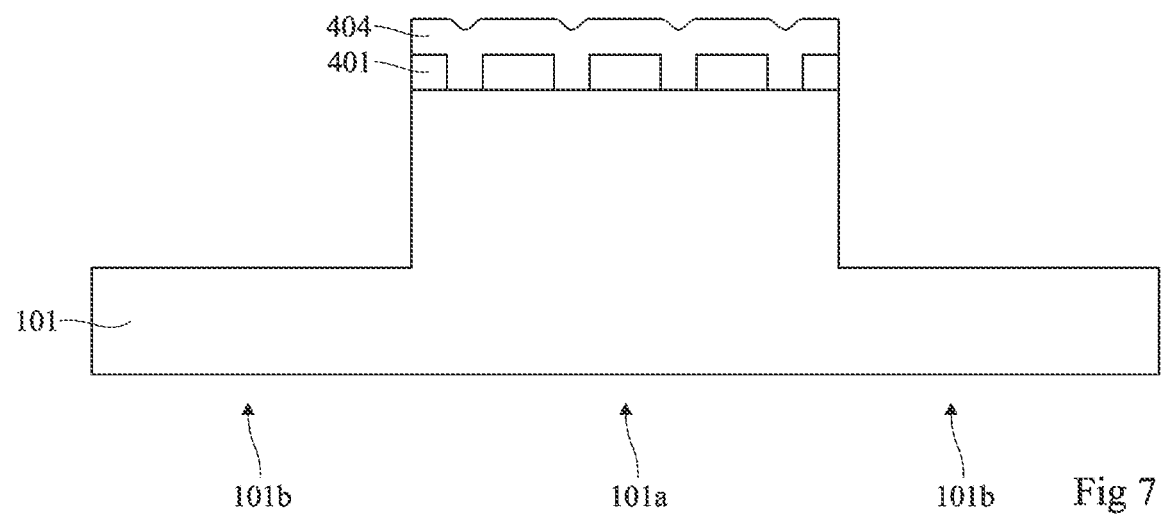
FIG. 7 is a simplified cross-section view illustrating another step of a method of manufacturing an integrated circuit comprising a three-dimensional capacitor.

FIG. 7 illustrates a step of partial etching of substrate 101, from its upper surface, opposite the exposed portions of the upper surface of the substrate (after the local removal of layers 401 and 404), that is, in peripheral region 101b of the substrate. During this step, a portion of the thickness of the substrate is removed from its peripheral portion 101b. The initial thickness of substrate 101 is however kept in its central portion 101a, due to the presence of masking layers 401 and 404. The etching implemented at this step is for example a plasma etching. In this example, the etching implemented is a vertical anisotropic etching. Thus, the sides of the island or mesa formed in central portion 101a of the substrate are substantially vertical and aligned with the edge of masking layers 401 and 404. During this step, the etch depth is selected according to the height of the step which is desired to be created between peripheral portion 101b and central portion 101a of the substrate, for example, in the range from 10 to 40 µm.

Figure 8:
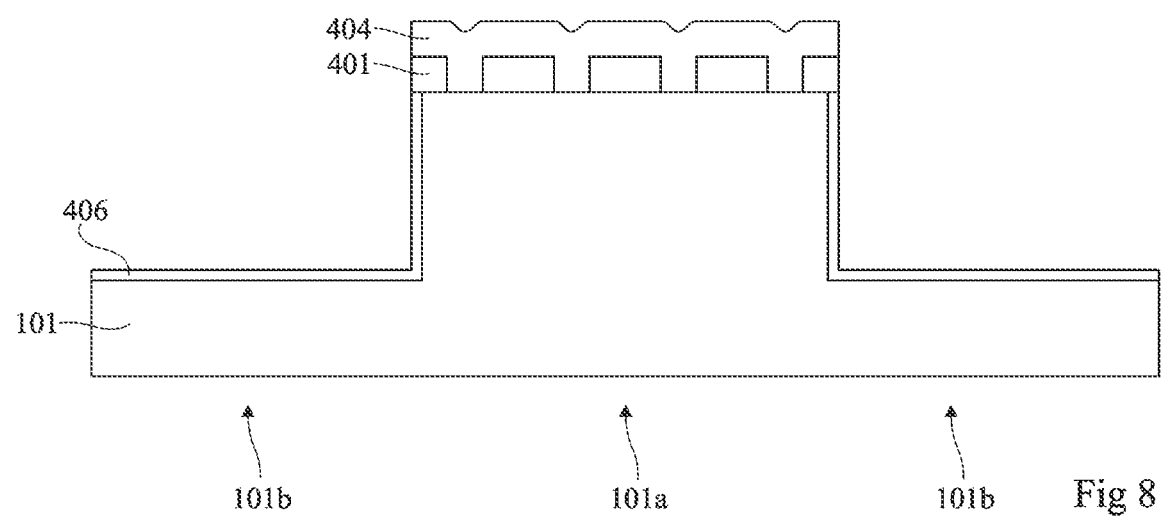
FIG. 8 is a simplified cross-section view illustrating another step of a method of manufacturing an integrated circuit comprising a three-dimensional capacitor.

FIG. 8 illustrates a subsequent step of forming of an insulating layer 406, for example, made of silicon oxide, on the portions of the surface of the substrate exposed during the etch step of FIG. 7, that is, on the upper surface of peripheral portion 101b of the substrate and on the sides of the island or mesa formed in central portion 101a of the substrate. Insulating layer 406 is for example formed by thermal oxidation of the exposed surfaces of substrate 101.

Figure 9:
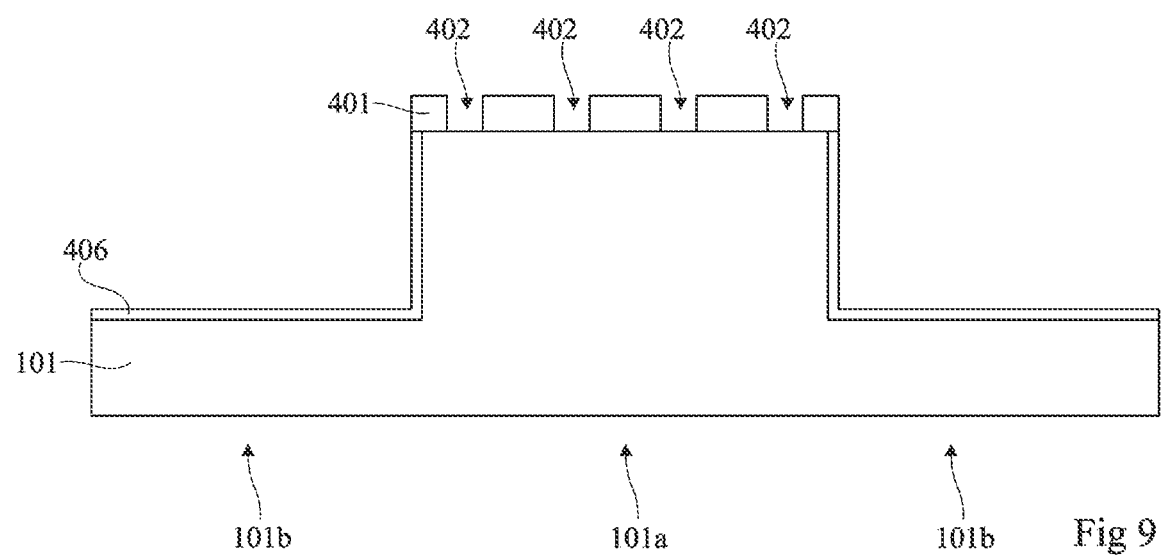
FIG. 9 is a simplified cross-section view illustrating another step of a method of manufacturing an integrated circuit comprising a three-dimensional capacitor.

FIG. 9 illustrates a step of removal of protection layer 404, selectively over hard mask 401 and insulating layer 406. Layer 404 is for example removed by wet etching.

Figure 10:
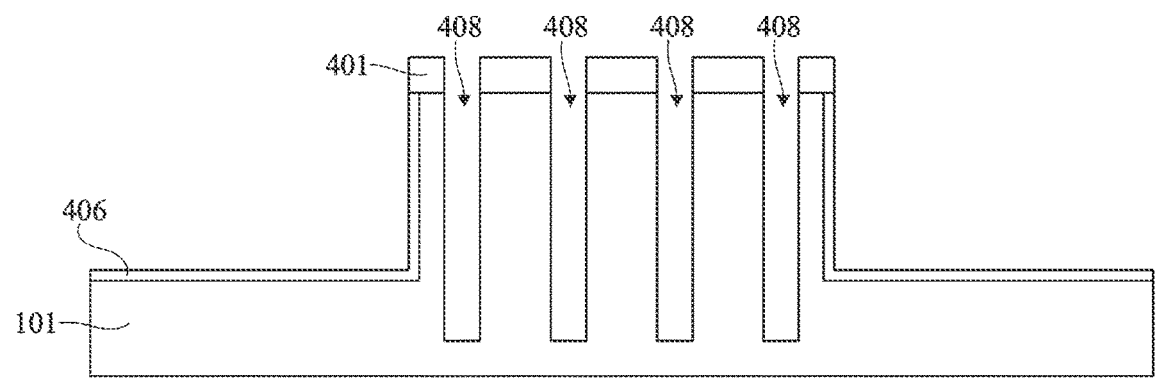
FIG. 10 is a simplified cross-section view illustrating another step of a method of manufacturing an integrated circuit comprising a three-dimensional capacitor.

FIG. 10 illustrates a subsequent step of etching of trenches 408 extending vertically in central portion 101a of substrate 101, from the upper surface thereof, opposite openings 402 of hard mask 401. Trenches 408 are intended to subsequently receive layers 103, 104, and 105 of the three-dimensional capacitor of the circuit. The trenches are for example formed by a plasma etching method. The etch method is selected to etch the material of substrate 101 selectively over the materials of layers 401 and 406. Thus, layer 406 protects peripheral portion 101b of substrate during the etching.

At the end of the step of FIG. 10, hard mask 401 and layer 406 may be removed. The next steps of deposition of the capacitive stack of layers 103, 104, and 105 and of forming of upper insulating protection layers 111 and 113 and of connection terminals 107 and 109 have not been shown and will not be detailed, these steps corresponding to conventional steps of the forming of a three-dimensional capacitor in an integrated circuit.

Figure 11:
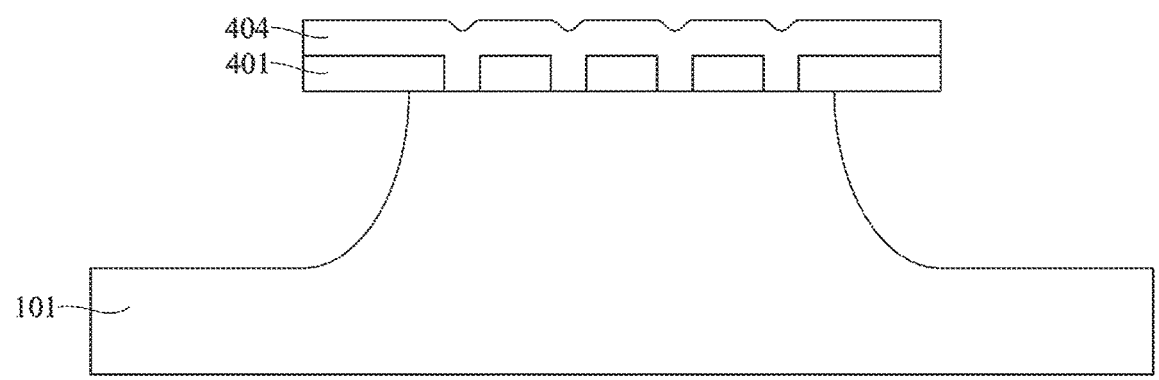
FIG. 11 is a simplified cross-section view illustrating an alternative embodiment of the method of FIGS. 4 to 10.

FIG. 11 is a simplified cross-section view illustrating an alternative embodiment of the method of FIGS. 4 to 10. FIG. 11 more particularly illustrates a step corresponding to the step of FIG. 7 of partial etching of substrate 101 in its peripheral portion 101b. In this example, rather than performing a vertical anisotropic etching such as described in relation with FIG. 7, an isotropic etching is performed, which enables to round the angle formed between peripheral portion 101b and central portion 101a of substrate 101, at the base of the island or mesa formed in central portion 101a of substrate 101. The other steps of the method are identical or similar to what has been described in relation with FIGS. 4 to 10. Such a variation particularly enables to ease the steps of deposition of upper layers 103, 104, 105, 111 and/or 113.

Figure 12:
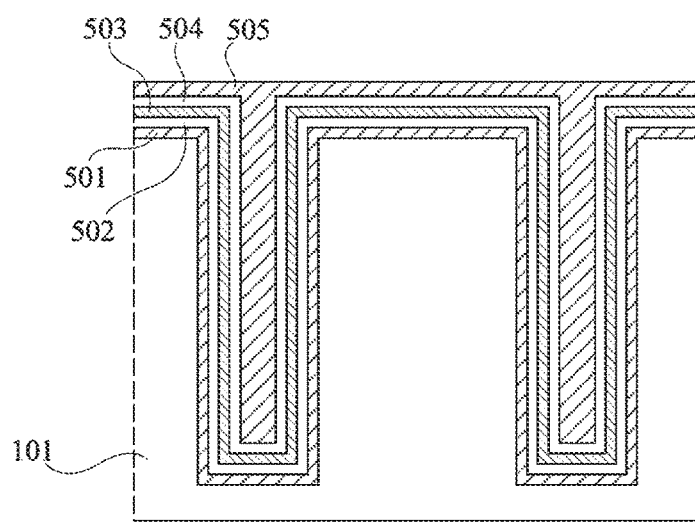
FIG. 12 is a partial simplified cross-section view illustrating another example of an integrated circuit comprising a three-dimensional capacitor according to an embodiment.

FIG. 12 is a partial simplified cross-section view illustrating another example of an integrated circuit comprising a three-dimensional capacitor 100C according to an embodiment.

In the previously-described examples, the three-dimensional capacitor 100B formed of a stack of two conductive layers separated by a dielectric layer has been considered.

As a variation, the capacitor 100C may be formed of a stack of three conductive layers, separated two by two by dielectric layers, such as illustrated in FIG. 12.

In FIG. 12, only a portion of the three-dimensional capacitor has been shown.

In this example, the capacitor is formed on a stack of a first conductive layer 501, of a first dielectric layer 502, of a second conductive layer 503, of a second dielectric layer 504, and of a third conductive layer 505, extending continuously over the upper surface of the substrate, as well as on the lateral walls and on the bottom of trenches. Each of layers 501, 503, and 505 is for example made of polysilicon or of metal. Insulating layers 502 and 504 are for example made of silicon oxide. Although this is not shown in FIG. 12, an insulating layer, for example, made of silicon oxide, may form an interface between conductive layer 501 and substrate 101.

As an example, conductive layers 501 and 505 are connected to a same first connection terminal of the capacitor, for example, terminal 107 in the examples of FIGS. 2 and 3, and conductive layer 503 is connected to a second connection terminal of the capacitor, for example, terminal 109 in the examples of FIGS. 2 and 3. This amounts to connecting in parallel, between terminals 107 and 109, a first capacitor formed between conductive layers 501 and 503 and a second capacitor formed between conductive layers 503 and 505. This enables to further increase the capacitance per surface area unit with respect to a three-dimensional capacitor with three layers of the type described in relation with FIG. 2 or 3.

Various embodiments and variations have been described. It will be understood by those skilled in the art that certain features of these various embodiments and variations may be combined, and other variations will occur to those skilled in the art. In particular, the described embodiments are not limited to the examples of materials and of dimensions mentioned in the present disclosure.

Further, the described embodiments are not limited to the embodiments of the connection terminals of the integrated circuits described in relation with FIGS. 2 and 3. As a variation, connection terminals 107 and 109 may each comprise a metal pillar, for example, made of copper, protruding from the upper surface of the integrated circuit, intended to be welded or soldered to a metal area of connection of an external device.

Further, although the examples detailed hereabove concern integrated circuits only comprising one three-dimensional capacitor and two connection terminals, the described embodiments are not limited to this specific case. As a variation, the described integrated circuits may comprise additional components, for example, semiconductor components, for example, of diode, transistor, or other type. Such additional components may for example be connected or coupled to the three-dimensional capacitor of the circuit.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit comprising:
   a substrate that includes a first region having a first thickness and a second region having a second thickness smaller than the first thickness;
   a three-dimensional capacitor formed inside and on top of the first region;
   first and second connection terminals formed on the second region, the first and second connection terminals being respectively connected to first and second electrodes of the three-dimensional capacitor; and
   an insulating protection layer extending on the second region of the substrate, the insulating protection layer not extending on the first region of the substrate.

2. The integrated circuit of claim 1, wherein the three-dimensional capacitor comprises:
   trenches formed in the first region of the substrate, the trenches having respective bottoms and lateral walls; and
   a stack of a first conductive layer, a first dielectric layer, and a second conductive layer arranged on a side of the first dielectric layer opposite to the first conductive layer, the stack extending on the lateral walls and on the bottoms of the trenches formed in the first region of the substrate, the first and second layers respectively forming the first and second electrodes of the three-dimensional capacitor.

3. The integrated circuit of claim 2, wherein the stack further comprises:
   a second dielectric layer arranged on a side of the second conductive layer opposite to the first dielectric layer, and
   a third conductive layer arranged on a side of the second dielectric layer opposite to the second conductive layer, the third conductive layer being connected to the first connection terminal.

4. The integrated circuit of claim 1, wherein the first region is a central region of the substrate, and the second region is a peripheral region of the substrate.

5. The integrated circuit of claim 1, wherein a surface of the substrate opposite to the first and second connection terminals is substantially planar.

6. The integrated circuit of claim 1, wherein the first and second thicknesses differ within a range from 10 to 40 µm.

7. The integrated circuit of claim 1, further comprising:
   third and fourth connection terminals respectively arranged opposite the first and second connection terminals, on a side of the substrate opposite to the first and second connection terminals;
   a first conductive via crossing the substrate and connecting the third connection terminal to the first connection terminal; and
   a second conductive via crossing the substrate and connecting the fourth connection terminal to the second connection terminal.

8. The integrated circuit of claim 1, wherein the first and second connection terminals each comprise a solder bump or a metallic connection pillar.

9. An integrated circuit comprising:
   a substrate that includes a first region having a first thickness and a second region having a second thickness smaller than the first thickness, the first region including a first surface and the second region having a second surface;
   a three-dimensional capacitor formed inside and on top of the first surface of the first region;
   an insulating layer positioned on the second surface of the second region and not extending on the first region; and
   first and second connection terminals formed on the insulating layer, the first and second connection terminals being respectively connected to first and second electrodes of the three-dimensional capacitor.

10. The integrated circuit of claim 9, wherein the three-dimensional capacitor comprises:
    trenches formed in the first region of the substrate, the trenches having respective bottoms and lateral walls; and
    a stack of a first conductive layer, a first dielectric layer, and a second conductive layer arranged on a side of the first dielectric layer opposite to the first conductive layer, the stack extending on the lateral walls and on the bottoms of the trenches formed in the first region of the substrate, the first and second layers respectively forming the first and second electrodes of the three-dimensional capacitor.

11. The integrated circuit of claim 10, wherein the stack further comprises:
    a second dielectric layer arranged on a side of the second conductive layer opposite to the first dielectric layer, and
    a third conductive layer arranged on a side of the second dielectric layer opposite to the second conductive layer, the third conductive layer being connected to the first connection terminal.

12. The integrated circuit of claim 9, the substrate includes a third surface opposite to the first and second surfaces, the third surface being substantially planar.

13. The integrated circuit of claim 12, further comprising:
    third and fourth connection terminals respectively arranged opposite the first and second connection terminals, on the third surface of the substrate;
    a first conductive via crossing the substrate and connecting the third connection terminal to the first connection terminal; and
    a second conductive via crossing the substrate and connecting the fourth connection terminal to the second connection terminal.

14. A device, comprising:
    a substrate having a first region and a second region, the first region having a first thickness, the second region having a second thickness smaller than the first thickness;
    a device on the first region, the first device including an electrode;
    a connection terminal on the second region, the connection terminal connected to the electrode of the device; and an insulating protection layer extending on the second region of the substrate, the insulating protection layer not extending on the first region of the substrate.

15. The device of claim 14, wherein the first region include a trench and the device is at least partially in the trench.

16. The device of claim 14, wherein the connection terminal includes a metallic connection pillar.

17. The device of claim 14, wherein the connection terminal is on a first surface of the second region of the substrate, a second surface of the substrate opposite to the first surface of the second region of the substrate is substantially planar.

18. The device of claim 14, wherein the first and second thicknesses differ within a range from 10 to 40 µm.

* * * * *